(12) United States Patent
Li et al.

(10) Patent No.: US 6,270,354 B2
(45) Date of Patent: *Aug. 7, 2001

(54) MULTI-CONNECTABLE PRINTED CIRCUIT BOARD

(75) Inventors: Delin Li, Canton; Jay DeAvis Baker, W. Bloomfield; Achyuta Achari, Canton; Brenda Joyce Nation; John Trublowski, both of Troy, all of MI (US)

(73) Assignee: Visteon Global Technologies, Inc., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/387,202

(22) Filed: Aug. 31, 1999

(51) Int. Cl.$^7$ .................................................... H01R 12/00
(52) U.S. Cl. ................................................................ 439/55
(58) Field of Search .............................. 439/55, 951, 59, 439/62

(56) References Cited

U.S. PATENT DOCUMENTS

| | | | |
|---|---|---|---|
| 3,033,914 | * 5/1962 | Acosta-Lleras | 439/55 |
| 3,605,061 | * 9/1971 | Martin | 439/55 |
| 5,010,446 | * 4/1991 | Scannell | 439/59 |
| 5,255,155 | 10/1993 | Sugimoto et al. | 361/749 |
| 5,712,764 | 1/1998 | Baker et al. | 361/690 |

FOREIGN PATENT DOCUMENTS

| | | |
|---|---|---|
| 1665071 | * 1/1971 | (DE). |
| 3628981 A1 | * 3/1988 | (DE). |

* cited by examiner

*Primary Examiner*—Tulsidas Patel
(74) *Attorney, Agent, or Firm*—Brinks Hofer Gilson & Lione

(57) ABSTRACT

A multi-connectable printed circuit assembly, comprising: (a) a printed circuit substrate 11 having a first edge 22 and first and second edge regions 44/55, wherein at least the first edge region 44 is defined along the first edge 22; (b) a first array 77 of electrical connection features 66 disposed on or within the substrate proximate the first edge region 44; (c) a second array 88 of electrical connection features 66 disposed on or within the substrate proximate the second edge region 55, wherein the second array 88 is substantially a duplication or a mirror image of the first array 77; and (d) a plurality of circuit traces 99 disposed on or within the substrate such that each electrical connection feature 66 of the first array 77 is connected by one of the circuit traces 99 to a corresponding electrical connection feature 66 of the second array 88.

20 Claims, 2 Drawing Sheets

MULTI-CONNECTABLE PRINTED CIRCUIT BOARD

BACKGROUND OF THE INVENTION

1. Field of the Invention

The present invention relates generally to printed circuit boards, and more particularly to printed circuit board connectors.

2. Disclosure Information

A typical layout for a PCB (printed circuit board) and a mating electrical connector 00 is illustrated in FIG. 1. Here, the connector 00 is shown as a flex circuit having circuit traces which terminate into rectangular mounting or soldering pads along a distal edge. (Although not shown in the drawings, the mating connector 00 may be part of an electrical device, an electronic circuit or module, an instrument, a sensor, etc.) The pads of the mating connector 00 are aligned upon corresponding mounting pads 66 disposed along an edge 22 on the PCB substrate 11, and are then attached thereto by soldering or the like. Although the contacts on the mating connector 00 are illustrated here as being mounting pads, they may alternatively by plated through holes, plated blind vias, male connector pins, sliding contacts that are mechanically clamped or crimped onto the PCB pads 66, etc.

If the device or circuit associated with the mating connector 00 becomes damaged or has a failed component, it may become necessary to disconnect the connector 00 from the PCB. However, the disconnecting process (e.g., de-soldering) may present the risk of damage to the PCB, and may also be quite inconvenient (e.g., if no de-soldering equipment is readily available). It would be desirable, therefore, to provide a way of facilitating disconnection of the mating connector from the PCB, and to provide for subsequent connection of a replacement mating connector, while minimizing the aforementioned inconvenience and risk of damage.

SUMMARY OF THE INVENTION

The present invention overcomes the disadvantages of prior art approaches by providing a multi-connectable printed circuit assembly, comprising: (a) a printed circuit substrate having a first edge and first and second edge regions, wherein at least the first edge region is defined along the first edge; (b) a first array of electrical connection features disposed on or within the substrate proximate the first edge region; (c) a second array of electrical connection features disposed on or within the substrate proximate the second edge region, wherein the second array is substantially a duplication or a mirror image of the first array; and (d) a plurality of circuit traces disposed on or within the substrate such that each electrical connection feature of the first array is connected by one of the circuit traces to a corresponding electrical connection feature of the second array.

It is an object and advantage that the present invention facilitates easy disconnection of a mating connector from a PCB, as well as easy reconnection of a replacement mating connector to the PCB.

Another advantage is that the present invention may be used with a wide variety of PCB types.

These and other advantages, features and objects of the invention will become apparent from the drawings, detailed description and claims which follow.

DETAILED DESCRIPTION OF THE PREFERRED EMBODIMENTS

Figure 1:
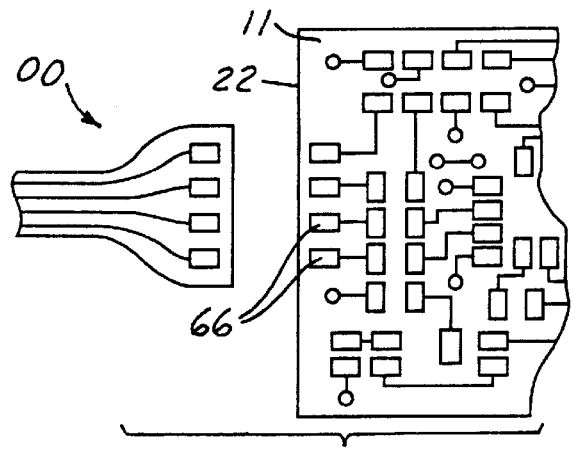
FIG. 1 is a partial plan view of a printed circuit board having electrical connection features thereon and a mating connector according to the prior art.
Figure 2:
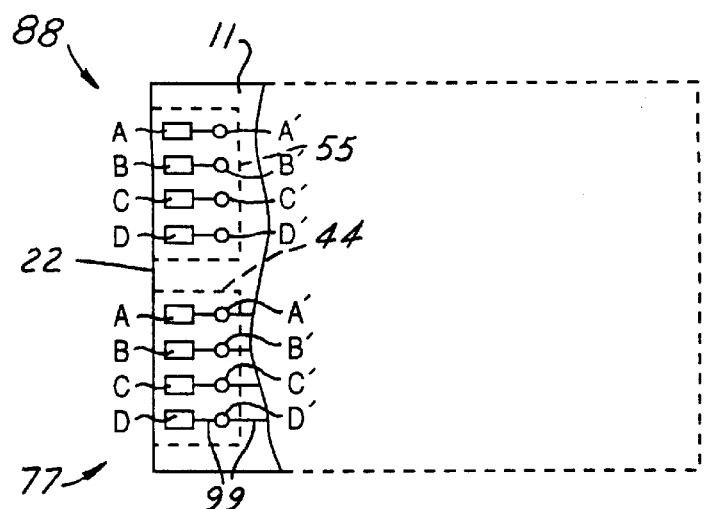
FIG. 2 is a partial plan view of a multi-connectable printed circuit board according to a first embodiment of the present invention.
Figure 3:
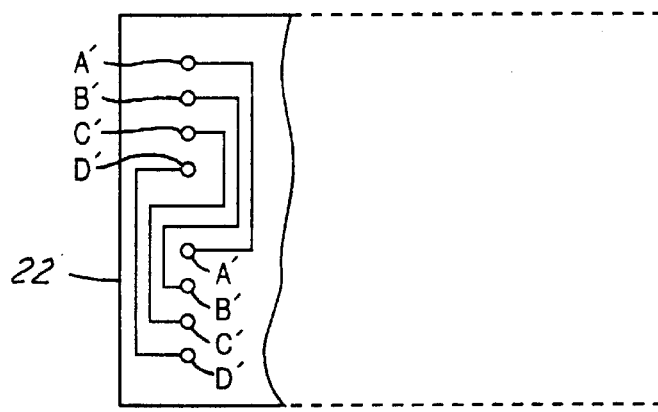
FIG. 3 is a partial plan view of an interior circuit layer of the printed circuit board shown in FIG. 2.
Figure 4:
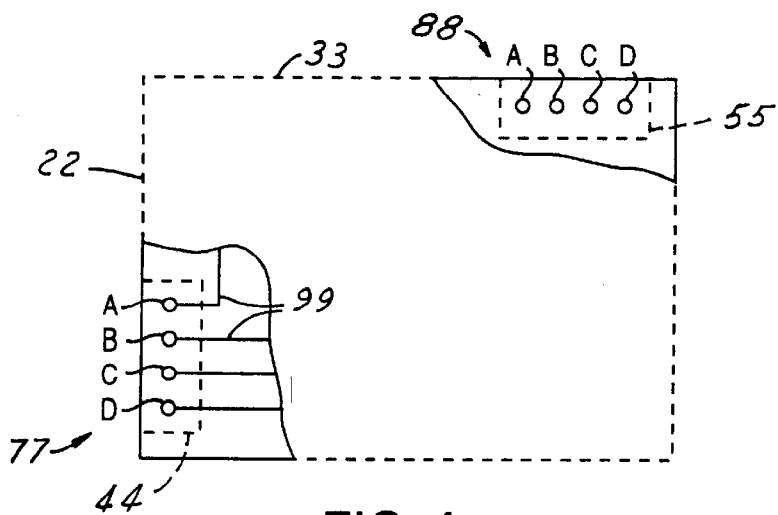
FIG. 4 is a partial plan view of a multi-connectable printed circuit board according to a second embodiment of the present invention.
Figure 5:
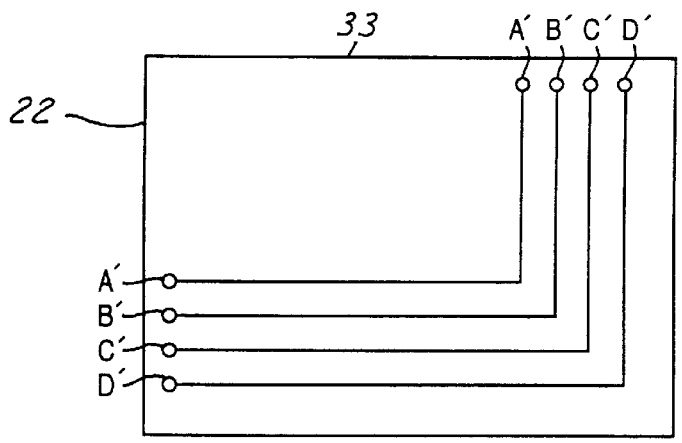
FIG. 5 is a partial plan view of an interior circuit layer of the printed circuit board shown in FIG. 4.

Referring now to the drawings, FIGS. 2–6 show a multi-connectable printed circuit board assembly according to the present invention. As illustrated in the drawings, the assembly includes: (a) a printed circuit substrate 11 having a first edge 22 and first and second edge regions 44/55, wherein at least the first edge region 44 is defined along the first edge 22; (b) a first array 77 of electrical connection features 66 disposed on or within the substrate proximate the first edge region 44; (c) a second array 88 of electrical connection features 66 disposed on or within the substrate proximate the second edge region 55, wherein the second array 88 is substantially a duplication or a mirror image of the first array 77; and (d) a plurality of circuit traces 99 disposed on or within the substrate such that each electrical connection feature 66 of the first array 77 is connected by one of the circuit traces 99 to a corresponding electrical connection feature 66 of the second array 88.

Figure 6:
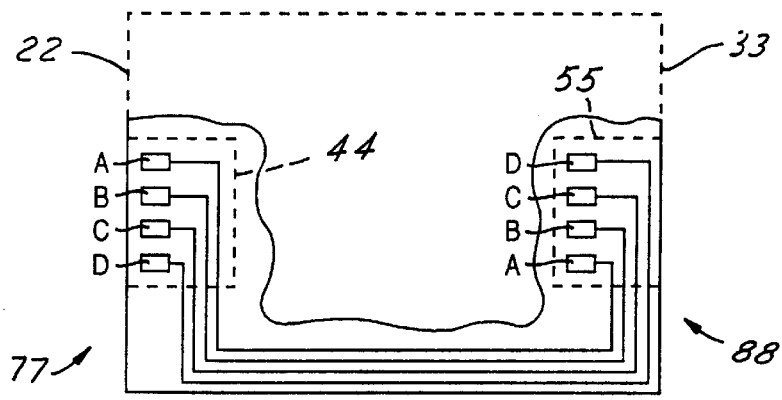
FIG. 6 is a partial plan view of a multi-connectable printed circuit board according to a third embodiment of the present invention.

To assist the reader in understanding the present invention, all reference numbers used herein are summarized in the table below, along with the elements they represent:

11=Substrate
22=First edge of substrate
33=Second edge of substrate
44=First edge region
55=Second edge region
66=Electrical connection features
77=First array of electrical connection features
88=Second array of electrical connection features
99=Circuit traces
00=Mating connector
A–D=Specific electrical connection features 66
A'–D'=Specific plated through holes/vias 66' for A–D The first and second connector arrays 77/88 may be located along the same edge 22 of the substrate (FIGS. 2–3), or along adjacent edges 22/33 (FIGS. 4–5), or on edges 22/33 at opposite ends of the substrate (FIG. 6). The electrical connection features 66 of the first and second arrays 77/88 may be plated through holes, plated blind vias, mounting pads/solder pads, or the like. The edges 22/33 proximate to which or along which the connector arrays 77/88 are disposed may extend locally outward (away from the board) at the edge regions 44/55, or may be recessed locally inward thereat, or may remain relatively undeviated. For example, a given edge region may extend locally outward in the form of a single tab on which the connectors 66 are formed, or may extend outward as a number or "fingers" on which mounting pads 66 are formed, thereby acting as a male feature or "jack" onto or around which a female electrical connector or "plug" may be connectably fitted.

The substrate 11 may be made of generally rigid ceramic material (e.g., alumina), generally rigid polymeric material (e.g., FR-4 epoxy-glass laminate; filled or unfilled injection molded thermoplastic or thermoset material such as acrylonitrile-butadiene-styrene, epoxy, polyester, polyolefin; etc.), generally flexible polymeric material (e.g., "flex circuitry" made of relatively thin sheets of polyester, polyimide, etc.), or the like.

The circuit traces 99 that connect together corresponding connector elements 66 between the arrays 77/88 may extend along one or both sides of the circuit board, and/or may connect with plated through-holes or plated blind vias which extend through the various layers of the board, and/or may be routed along the various inner conductive layers of the board.

With the individual connector elements 66 of one array 77 connected through circuit traces 99 to their corresponding individual elements 66 of the other array 88 as shown in the drawings, each array 77/88 is essentially a duplicate or a mirror image of the other. This redundancy of connector arrays is useful when it is desired to temporarily disconnect the PCB from the mating connector 00 and then subsequently re-connect it. This may be done, for example, when the device or circuit associated with the mating connector 00 needs to be separated from the PCB (e.g., due to damage, a component failure, etc.), followed by attaching a new mating connector 00 to the PCB. If the mating connector 00 is made of flex circuit material, the flex can simply be cut with scissors (preferably flush with the edge of the substrate 11), leaving a small tab of flex material and its connector elements attached to the PCB at the first array 77. Then, a new mating connector 00 can be aligned and attached the PCB at the second connector array 88. Regardless of whether the array regions 44/55 are on the same edge 22 or different edges 22/33, the mating connector 00 can be connected to the PCB in a duplicated orientation (see FIGS. 2, 3, and 6, where elements A through D run counter-clockwise around the PCB), or turned upside down and connected in a mirror image orientation (see FIGS. 4–5, where A through D runs counter-clockwise in the first region 44, but runs clockwise in the second region 55).

Various other modifications to the present invention may occur to those skilled in the art to which the present invention pertains. For example, the PCB assembly may not only have two similar connector arrays 77/88, but may optionally have three or more of such arrays if desired. Other modifications not explicitly mentioned herein are also possible and within the scope of the present invention. It is the following claims, including all equivalents, which define the scope of the present invention.

What is claimed is:

1. A multi-connectable printed circuit assembly, comprising:
    a printed circuit substrate having a first edge and first and second edge regions, wherein at least said first edge region is defined along said first edge;
    a first array of electrical connection features disposed on or within said substrate proximate said first edge region;
    a second array of electrical connection features disposed on or within said substrate proximate said second edge region, wherein each connection feature of said first array is connected to a corresponding electrical connection feature of said second array and wherein said second array provides redundancy of said first array of electrical connection features;
    a plurality of circuit traces disposed on or within said substrate such that each electrical connection feature of said first array is connected by one of said circuit traces to a corresponding electrical connection feature of said second array; and
    a first mating electrical connector connected to said first array of electrical connection features;
    wherein said second array of electrical connection features is adapted to connect to a second mating electrical connector and, whereby, in use of said printed circuit assembly, said first mating electrical connector remains connected to said first array of electrical connection features and said second array of electrical connection features is optionally connectable to a second mating electrical connector such that said second array of electrical connection features is redundant of said first set of electrical connection features and is provided for use in servicing or replacement of said printed circuit assembly.

2. A multi-connectable printed circuit assembly according to claim 1, wherein said first and second edge regions are defined along said first edge.

3. A multi-connectable printed circuit assembly according to claim 1, wherein said second edge region is defined along a second edge of said substrate.

4. A multi-connectable printed circuit assembly according to claim 3, wherein said first and second edges are defined on respective opposite ends of said substrate.

5. A multi-connectable printed circuit assembly according to claim 3, wherein said first and second edges are adjacent one another.

6. A multi-connectable printed circuit assembly according to claim 1, wherein each of said electrical connection features is a plated through hole, a plated blind via, or a mounting pad.

7. A multi-connectable printed circuit assembly according to claim 1, wherein said printed circuit substrate is made of a substantially rigid ceramic material.

8. A multi-connectable printed circuit assembly according to claim 1, wherein said printed circuit substrate is made of a substantially rigid polymeric material.

9. A multi-connectable printed circuit assembly according to claim 1, wherein said printed circuit substrate is made of a substantially flexible polymeric material.

10. A multi-connectable printed circuit assembly, comprising:
    a printed circuit substrate having a first edge and first and second edge regions, wherein at least said first edge region is defined along said first edge;
    a first array of electrical connection features disposed on or within said substrate proximate said first edge region;
    a second array of electrical connection features disposed on or within said substrate proximate said second edge region, corresponding electrical connection feature of said second array and wherein said second array wherein each connection feature of said first array is connected to a provides redundancy of said first array of electrical connection features;
    a plurality of circuit traces disposed on or within said substrate such that each electrical connection feature of said first array is connected by one of said circuit traces to a corresponding electrical connection feature of said second array; and a first mating electrical connector connected to said first array of electrical connection features;

wherein each of said electrical connection features is a plated through hole, a plated blind via, or a mounting pad;

wherein said printed circuit substrate is made of a substantially rigid ceramic material, a substantially rigid polymeric material, or a substantially flexible polymeric material; and wherein said second array of electrical connection features is adapted to connect to a second mating electrical connector and, whereby, in use of said printed circuit assembly, said first mating electrical connector remains connected to said first array of electrical connection features and said second array of electrical connection features is optionally connectable to a second mating electrical connector such that said second array of electrical connection features is redundant of said first set of electrical connection features and is provided for use in servicing or replacement of said printed circuit assembly.

11. A multi-connectable printed circuit assembly according to claim 10, wherein said first and second edge regions are defined along said first edge.

12. A multi-connectable printed circuit assembly according to claim 10, wherein said second edge region is defined along a second edge of said substrate.

13. A multi-connectable printed circuit assembly according to claim 12, wherein said first and second edges are defined on respective opposite ends of said substrate.

14. A multi-connectable printed circuit assembly according to claim 12, wherein said first and second edges are adjacent one another.

15. A multi-connectable printed circuit assembly, comprising:

a printed circuit substrate having a first edge and first and second edge regions, wherein at least said first edge region is defined along said first edge;

a first array of electrical connection features disposed on or within said substrate proximate said first edge region;

a second array of electrical connection features substantially similar to said first array disposed on or within said substrate proximate said second edge region;

a plurality of circuit traces disposed on or within said substrate such that each electrical connection feature of said first array is connected by one of said circuit traces to a corresponding electrical connection feature of said second array; and a first mating electrical connector connected to said first array of electrical connection features;

wherein said second array of electrical connection features is adapted to connect to a second mating electrical connector and, whereby, in use of said printed circuit assembly, said first mating electrical connector remains connected to said first array of electrical connection features and said second array of electrical connection features is optionally connectable to a second mating electrical connector such that said second array of electrical connection features is redundant of said first set of electrical connection features and is provided for use in servicing or replacement of said printed circuit assembly.

16. A multi-connectable printed circuit assembly according to claim 15, wherein said first and second edge regions are defined along said first edge.

17. A multi-connectable printed circuit assembly according to claim 15, wherein said second edge region is defined along a second edge of said substrate.

18. A multi-connectable printed circuit assembly according to claim 17, wherein said first and second edges are defined on respective opposite or adjacent ends of said substrate.

19. A multi-connectable printed circuit assembly according to claim 15, wherein each of said electrical connection features is a plated through hole, a plated blind via, or a mounting pad.

20. A multi-connectable printed circuit assembly according to claim 15, wherein said printed circuit substrate is made of a substantially rigid ceramic material, a substantially rigid polymeric material, or a substantially flexible polymeric material.

* * * * *